United States Patent
Jo et al.

(10) Patent No.: US 8,946,669 B1
(45) Date of Patent: Feb. 3, 2015

(54) RESISTIVE MEMORY DEVICE AND FABRICATION METHODS

(75) Inventors: Sung Hyun Jo, Sunnyvale, CA (US); Kuk-Hwan Kim, San Jose, CA (US); Tanmay Kumar, Pleasaton, CA (US)

(73) Assignee: Crossbar, Inc., Santa Clara, CA (US)

( * ) Notice: Subject to any disclaimer, the term of this patent is extended or adjusted under 35 U.S.C. 154(b) by 0 days.

(21) Appl. No.: 13/586,815

(22) Filed: Aug. 15, 2012

Related U.S. Application Data

(60) Provisional application No. 61/620,561, filed on Apr. 5, 2012.

(51) Int. Cl.
 *H01L 29/02* (2006.01)

(52) U.S. Cl.
 USPC .......... 257/2; 257/43; 257/298; 257/E29.095; 438/95; 438/102; 438/104; 438/382

(58) Field of Classification Search
 CPC ....... H01L 27/101; H01L 45/04; H01L 29/02; H01L 29/76
 USPC .................. 257/2–5, 43, 260, 298, 393, 401, 257/E29.095, E47.001; 438/95, 102, 104, 438/382, 482
 See application file for complete search history.

(56) References Cited

U.S. PATENT DOCUMENTS

| | | |
|---|---|---|
| 680,652 A | 8/1901 | Elden |
| 4,433,468 A | 2/1984 | Kawamata |
| 4,684,972 A | 8/1987 | Owen et al. |
| 4,741,601 A | 5/1988 | Saito |
| 5,139,911 A | 8/1992 | Yagi et al. |
| 5,242,855 A | 9/1993 | Oguro |
| 5,278,085 A | 1/1994 | Maddox, III et al. |
| 5,315,131 A | 5/1994 | Kishimoto et al. |
| 5,335,219 A | 8/1994 | Ovshinsky et al. |
| 5,360,981 A | 11/1994 | Owen et al. |
| 5,457,649 A | 10/1995 | Eichman et al. |
| 5,538,564 A | 7/1996 | Kaschmitter |
| 5,541,869 A | 7/1996 | Rose et al. |
| 5,594,363 A | 1/1997 | Freeman et al. |
| 5,614,756 A | 3/1997 | Forouhi et al. |
| 5,645,628 A | 7/1997 | Endo et al. |
| 5,714,416 A | 2/1998 | Eichman et al. |

(Continued)

FOREIGN PATENT DOCUMENTS

| | | |
|---|---|---|
| JP | 2005-506703 A | 3/2005 |
| JP | 2006-032951 A | 2/2006 |

(Continued)

OTHER PUBLICATIONS

Office Action for U.S. Appl. No. No. 12/861,650 dated Oct. 16, 2012.

(Continued)

*Primary Examiner* — Mark A Laurenzi
(74) *Attorney, Agent, or Firm* — Ogawa P.C.

(57) ABSTRACT

A method for forming a resistive memory device includes providing a substrate comprising a first metal material, forming a conductive silicon-bearing layer on top of the first metal material, wherein the conductive silicon-bearing layer comprises an upper region and a lower region, and wherein the lower region is adjacent to the first metal material, forming an amorphous layer from the upper region of the conductive silicon-bearing layer, and disposing an active metal material above the amorphous layer.

30 Claims, 3 Drawing Sheets

(56) References Cited

U.S. PATENT DOCUMENTS

| | | |
|---|---|---|
| 5,751,012 A | 5/1998 | Wolstenholme et al. |
| 5,840,608 A | 11/1998 | Chang |
| 5,970,332 A | 10/1999 | Pruijmboom et al. |
| 5,973,335 A | 10/1999 | Shannon |
| 5,998,244 A | 12/1999 | Wolstenholme et al. |
| 6,128,214 A | 10/2000 | Kuekes et al. |
| 6,143,642 A | 11/2000 | Sur, Jr. et al. |
| 6,259,116 B1 | 7/2001 | Shannon |
| 6,288,435 B1 | 9/2001 | Mei et al. |
| 6,291,836 B1 | 9/2001 | Kramer et al. |
| 6,436,765 B1 | 8/2002 | Liou et al. |
| 6,436,818 B1 | 8/2002 | Hu et al. |
| 6,492,694 B2 | 12/2002 | Noble et al. |
| 6,627,530 B2 | 9/2003 | Li et al. |
| 6,762,474 B1 | 7/2004 | Mills, Jr. |
| 6,768,157 B2 | 7/2004 | Krieger et al. |
| 6,815,286 B2 | 11/2004 | Krieger et al. |
| 6,821,879 B2 | 11/2004 | Wong |
| 6,838,720 B2 | 1/2005 | Krieger et al. |
| 6,858,481 B2 | 2/2005 | Krieger et al. |
| 6,858,482 B2 | 2/2005 | Gilton |
| 6,864,127 B2 | 3/2005 | Yamazaki et al. |
| 6,864,522 B2 | 3/2005 | Krieger et al. |
| 6,881,994 B2 | 4/2005 | Lee et al. |
| 6,927,430 B2 | 8/2005 | Hsu |
| 6,939,787 B2 | 9/2005 | Ohtake et al. |
| 6,946,719 B2 | 9/2005 | Petti et al. |
| 7,020,006 B2 | 3/2006 | Chevallier et al. |
| 7,023,093 B2 | 4/2006 | Canaperi et al. |
| 7,026,702 B2 | 4/2006 | Krieger et al. |
| 7,102,150 B2 | 9/2006 | Harshfield et al. |
| 7,122,853 B1 | 10/2006 | Gaun et al. |
| 7,187,577 B1 | 3/2007 | Wang et al. |
| 7,221,599 B1 | 5/2007 | Gaun et al. |
| 7,238,607 B2 | 7/2007 | Dunton et al. |
| 7,254,053 B2 | 8/2007 | Krieger et al. |
| 7,289,353 B2 | 10/2007 | Spitzer et al. |
| 7,324,363 B2 | 1/2008 | Kerns et al. |
| 7,365,411 B2 | 4/2008 | Campbell |
| 7,405,418 B2 | 7/2008 | Happ et al. |
| 7,426,128 B2 | 9/2008 | Scheuerlein |
| 7,433,253 B2 | 10/2008 | Gogl et al. |
| 7,474,000 B2 | 1/2009 | Scheuerlein et al. |
| 7,479,650 B2 | 1/2009 | Gilton |
| 7,499,355 B2 | 3/2009 | Scheuerlein et al. |
| 7,521,705 B2 | 4/2009 | Liu |
| 7,534,625 B2 | 5/2009 | Karpov et al. |
| 7,541,252 B2 | 6/2009 | Eun et al. |
| 7,550,380 B2 | 6/2009 | Elkins et al. |
| 7,566,643 B2 | 7/2009 | Czubatyi et al. |
| 7,606,059 B2 | 10/2009 | Toda |
| 7,615,439 B1 | 11/2009 | Schricker et al. |
| 7,629,198 B2 | 12/2009 | Kumar et al. |
| 7,719,001 B2 | 5/2010 | Nomura et al. |
| 7,728,318 B2 | 6/2010 | Raghuram et al. |
| 7,729,158 B2 | 6/2010 | Toda et al. |
| 7,749,805 B2 | 7/2010 | Pinnow et al. |
| 7,772,581 B2 | 8/2010 | Lung |
| 7,778,063 B2 | 8/2010 | Brubaker et al. |
| 7,786,464 B2 | 8/2010 | Nirschl et al. |
| 7,786,589 B2 | 8/2010 | Matsunaga et al. |
| 7,824,956 B2 | 11/2010 | Schricker et al. |
| 7,829,875 B2 | 11/2010 | Scheuerlein |
| 7,835,170 B2 | 11/2010 | Bertin et al. |
| 7,859,884 B2 | 12/2010 | Scheuerlein |
| 7,875,871 B2 | 1/2011 | Kumar et al. |
| 7,881,097 B2 | 2/2011 | Hosomi et al. |
| 7,883,964 B2 | 2/2011 | Goda et al. |
| 7,897,953 B2 | 3/2011 | Liu |
| 7,898,838 B2 | 3/2011 | Chen et al. |
| 7,920,412 B2 | 4/2011 | Hosotani et al. |
| 7,924,138 B2 | 4/2011 | Kinoshita et al. |
| 7,968,419 B2 | 6/2011 | Li et al. |
| 7,972,897 B2 | 7/2011 | Kumar et al. |
| 8,004,882 B2 | 8/2011 | Katti et al. |
| 8,018,760 B2 | 9/2011 | Muraoka et al. |
| 8,021,897 B2 | 9/2011 | Sills et al. |
| 8,045,364 B2 | 10/2011 | Schloss et al. |
| 8,054,674 B2 | 11/2011 | Tamai et al. |
| 8,067,815 B2 | 11/2011 | Chien et al. |
| 8,071,972 B2 | 12/2011 | Lu et al. |
| 8,084,830 B2 | 12/2011 | Kanno et al. |
| 8,088,688 B1 | 1/2012 | Herner |
| 8,097,874 B2 | 1/2012 | Venkatasamy et al. |
| 8,102,698 B2 | 1/2012 | Scheuerlein |
| 8,143,092 B2 | 3/2012 | Kumar et al. |
| 8,144,498 B2 | 3/2012 | Kumar et al. |
| 8,164,948 B2 | 4/2012 | Katti et al. |
| 8,168,506 B2 | 5/2012 | Herner |
| 8,183,553 B2 | 5/2012 | Phatak et al. |
| 8,207,064 B2 | 6/2012 | Bandyopadhyay et al. |
| 8,227,787 B2 | 7/2012 | Kumar et al. |
| 8,233,308 B2 | 7/2012 | Schricker et al. |
| 8,237,146 B2 | 8/2012 | Kreupl et al. |
| 8,374,018 B2 | 2/2013 | Lu |
| 8,385,100 B2 | 2/2013 | Kau et al. |
| 8,394,670 B2 | 3/2013 | Herner |
| 8,467,227 B1 | 6/2013 | Jo |
| 8,658,476 B1 | 2/2014 | Sun et al. |
| 8,659,003 B2 | 2/2014 | Herner et al. |
| 2003/0141565 A1 | 7/2003 | Hirose et al. |
| 2004/0026682 A1 | 2/2004 | Jiang |
| 2004/0170040 A1 | 9/2004 | Rinerson et al. |
| 2004/0202041 A1 | 10/2004 | Hidenori |
| 2005/0020510 A1 | 1/2005 | Benedict |
| 2005/0029587 A1 | 2/2005 | Harshfield |
| 2005/0052915 A1 | 3/2005 | Herner et al. |
| 2005/0062045 A1 | 3/2005 | Bhattacharyya |
| 2005/0073881 A1 | 4/2005 | Tran et al. |
| 2005/0101081 A1 | 5/2005 | Goda et al. |
| 2006/0017488 A1 | 1/2006 | Hsu |
| 2006/0134837 A1 | 6/2006 | Subramanian et al. |
| 2006/0246606 A1 | 11/2006 | Hsu et al. |
| 2006/0281244 A1 | 12/2006 | Ichige et al. |
| 2007/0008773 A1 | 1/2007 | Scheuerlein |
| 2007/0015348 A1 | 1/2007 | Hsu et al. |
| 2007/0045615 A1 | 3/2007 | Cho et al. |
| 2007/0087508 A1 | 4/2007 | Herner |
| 2007/0090425 A1 | 4/2007 | Kumar et al. |
| 2007/0105284 A1 | 5/2007 | Herner |
| 2007/0105390 A1 | 5/2007 | Oh |
| 2007/0205510 A1 | 9/2007 | Lavoie et al. |
| 2007/0228414 A1 | 10/2007 | Kumar et al. |
| 2007/0284575 A1 | 12/2007 | Li et al. |
| 2007/0290186 A1 | 12/2007 | Bourim et al. |
| 2007/0291527 A1 | 12/2007 | Tsushima et al. |
| 2007/0295950 A1 | 12/2007 | Cho et al. |
| 2008/0002481 A1 | 1/2008 | Gogl et al. |
| 2008/0006907 A1 | 1/2008 | Lee et al. |
| 2008/0048164 A1 | 2/2008 | Odagawa |
| 2008/0089110 A1 | 4/2008 | Robinett et al. |
| 2008/0090337 A1 | 4/2008 | Williams |
| 2008/0106925 A1 | 5/2008 | Paz de Araujo et al. |
| 2008/0106926 A1 | 5/2008 | Brubaker et al. |
| 2008/0185567 A1 | 8/2008 | Kumar et al. |
| 2008/0205179 A1 | 8/2008 | Markert et al. |
| 2008/0206931 A1 | 8/2008 | Breuil et al. |
| 2008/0220601 A1 | 9/2008 | Kumar et al. |
| 2008/0232160 A1 | 9/2008 | Gopalakrishnan |
| 2008/0278990 A1 | 11/2008 | Kumar et al. |
| 2008/0304312 A1 | 12/2008 | Ho et al. |
| 2008/0311722 A1 | 12/2008 | Petti et al. |
| 2009/0001345 A1 | 1/2009 | Schricker et al. |
| 2009/0014707 A1 | 1/2009 | Lu et al. |
| 2009/0052226 A1 | 2/2009 | Lee et al. |
| 2009/0095951 A1 | 4/2009 | Kostylev et al. |
| 2009/0152737 A1 | 6/2009 | Harshfield |
| 2009/0168486 A1 | 7/2009 | Kumar |
| 2009/0231910 A1 | 9/2009 | Liu et al. |
| 2009/0250787 A1 | 10/2009 | Kutsunai |
| 2009/0256130 A1 | 10/2009 | Schricker |
| 2009/0257265 A1 | 10/2009 | Chen et al. |
| 2009/0267047 A1 | 10/2009 | Sasago et al. |
| 2009/0298224 A1 | 12/2009 | Lowrey |

(56) References Cited

U.S. PATENT DOCUMENTS

| | | |
|---|---|---|
| 2009/0321789 A1 | 12/2009 | Wang et al. |
| 2010/0007937 A1 | 1/2010 | Widjaja et al. |
| 2010/0012914 A1 | 1/2010 | Xu et al. |
| 2010/0019221 A1 | 1/2010 | Lung et al. |
| 2010/0019310 A1 | 1/2010 | Sakamoto |
| 2010/0032637 A1 | 2/2010 | Kinoshita et al. |
| 2010/0032638 A1 | 2/2010 | Xu |
| 2010/0032640 A1 | 2/2010 | Xu |
| 2010/0044708 A1 | 2/2010 | Lin et al. |
| 2010/0084625 A1 | 4/2010 | Wicker et al. |
| 2010/0085798 A1 | 4/2010 | Lu et al. |
| 2010/0090192 A1 | 4/2010 | Goux et al. |
| 2010/0101290 A1 | 4/2010 | Bertolotto |
| 2010/0102290 A1 | 4/2010 | Lu et al. |
| 2010/0157651 A1 | 6/2010 | Kumar et al. |
| 2010/0157710 A1 | 6/2010 | Lambertson et al. |
| 2010/0163828 A1 | 7/2010 | Tu |
| 2010/0176368 A1 | 7/2010 | Ko et al. |
| 2010/0219510 A1 | 9/2010 | Scheuerlein et al. |
| 2010/0221868 A1 | 9/2010 | Sandoval |
| 2010/0321095 A1 | 12/2010 | Mikawa et al. |
| 2011/0006275 A1* | 1/2011 | Roelofs et al. ............ 257/2 |
| 2011/0089391 A1 | 4/2011 | Mihnea et al. |
| 2011/0128779 A1 | 6/2011 | Redaelli et al. |
| 2011/0133149 A1 | 6/2011 | Sonehara |
| 2011/0136327 A1 | 6/2011 | Han et al. |
| 2011/0155991 A1 | 6/2011 | Chen |
| 2011/0194329 A1 | 8/2011 | Ohba et al. |
| 2011/0198557 A1 | 8/2011 | Rajendran et al. |
| 2011/0204312 A1 | 8/2011 | Phatak |
| 2011/0205782 A1 | 8/2011 | Costa et al. |
| 2011/0212616 A1 | 9/2011 | Seidel et al. |
| 2011/0227028 A1 | 9/2011 | Sekar et al. |
| 2011/0284814 A1 | 11/2011 | Zhang |
| 2011/0305064 A1 | 12/2011 | Jo et al. |
| 2011/0312151 A1 | 12/2011 | Herner |
| 2011/0317470 A1 | 12/2011 | Lu et al. |
| 2012/0001146 A1 | 1/2012 | Lu et al. |
| 2012/0007035 A1 | 1/2012 | Jo et al. |
| 2012/0008366 A1 | 1/2012 | Lu |
| 2012/0012806 A1 | 1/2012 | Herner |
| 2012/0015506 A1 | 1/2012 | Jo et al. |
| 2012/0025161 A1 | 2/2012 | Rathor et al. |
| 2012/0033479 A1 | 2/2012 | Delucca et al. |
| 2012/0043519 A1 | 2/2012 | Jo et al. |
| 2012/0043520 A1 | 2/2012 | Herner et al. |
| 2012/0043621 A1 | 2/2012 | Herner |
| 2012/0043654 A1 | 2/2012 | Lu et al. |
| 2012/0080798 A1 | 4/2012 | Harshfield |
| 2012/0104351 A1 | 5/2012 | Wei et al. |
| 2012/0108030 A1 | 5/2012 | Herner |
| 2012/0142163 A1 | 6/2012 | Herner |
| 2012/0145984 A1 | 6/2012 | Rabkin et al. |
| 2012/0155146 A1 | 6/2012 | Ueda et al. |
| 2012/0205606 A1 | 8/2012 | Lee et al. |
| 2012/0220100 A1 | 8/2012 | Herner |
| 2012/0235112 A1 | 9/2012 | Huo et al. |
| 2012/0236625 A1 | 9/2012 | Ohba et al. |
| 2012/0305874 A1* | 12/2012 | Herner ............ 257/2 |
| 2012/0326265 A1 | 12/2012 | Lai et al. |
| 2013/0026440 A1 | 1/2013 | Yang et al. |
| 2014/0070160 A1 | 3/2014 | Ishikawa et al. |

FOREIGN PATENT DOCUMENTS

| | | |
|---|---|---|
| JP | 2007-067408 A | 3/2007 |
| JP | 2007-281208 A | 10/2007 |
| JP | 2007-328857 A | 12/2007 |
| KR | 1020110014248 A | 2/2011 |
| WO | WO 03/034498 A1 | 4/2003 |
| WO | WO 2009/005699 A1 | 1/2009 |
| WO | WO 2011/133138 A1 | 10/2011 |

OTHER PUBLICATIONS

Notice of Allowance for U.S. Appl. No. 12/894,087 dated Oct. 25, 2012.
Notice of Allowance for U.S. Appl. No. 13/149,807 dated Oct. 29, 2012.
Notice of Allowance for U.S. Appl. No. 12/861,666 dated Nov. 14, 2012.
Office Action for U.S. Appl. No. 13/156,232, dated Nov. 26, 2012.
Notice of Allowance for U.S. Appl. No. 13/290,024 dated Nov. 28, 2012.
Office Action for Application No. EP 1100 5207.3, mailed Aug. 8, 2012.
Office Action for U.S. Appl. No. 13/417,135 dated Oct. 9, 2012.
Notice of Allowance for U.S. Appl. No. 13/532,019 dated Nov. 14, 2012.
Office Action for U.S. Appl. No. 13/149,653 dated Nov. 20, 2012.
Office Action of U.S. Appl. No. 13/436,714 dated Dec. 7, 2012.
Jian Hu et al., "Area-Dependent Switching in Thin Film-Silicon Devices", Materials Research Society, Mal. Res. Soc. Symp Proc., 2003, pp. A18.3.1-A18.3.6, vol. 762.
André Dehon, "Array-Based Architecture for FET-Based, Nanoscale Electronics", IEEE Transactions on Nanotechnology, Mar. 2003, pp. 23-32, vol. 2, No. 1, IEEE.
Herb Goronkin et al., "High-Performance Emerging Solid-State memory Technologies", MRS Bulletin, www.mrs.org/publications/bulletin, Nov. 2004, pp. 805-813.
Gerhard Müller et al., "Status and Outlook of Emerging Nonvolatile Memory Technologies", IEEE, 2004, pp. 567-570.
A.E. Owen et al., "Memory Switching in Amorphous Silicon Devices", Journal of Non-Crystalline Solids 59 & 60, 1983, pp. 1273-1280, North Holland Publishing Company/Physical Society of Japan.
J. Campbell Scott, "Is There an Immortal Memory?", www.sciencemag.org, Apr. 2, 2004, pp. 62-63, vol. 304 No. 5667, American Association for the Advancement of Science.
S.H. Lee et al., "Full Integration and Cell Characteristics For 64Mb Nonvolatile PRAM", 2004 Symposium on VLSI Technology Digest of Technical Papers, IEEE, 2004, pp. 20-21.
Stephen Y. Chou et al., "Imprint Lithography With 25-Nanometer Resolution", Science, Apr. 5, 1996, pp. 85-87, vol. 272, American Association for the Advancement of Science.
S. Zankovych et al., "Nanoimprint Lithography: challenges and prospects", Nanotechnology, 2001, pp. 91-95, vol. 12, Institute of Physics Publishing.
A. Avila et al., "Switching in coplanar amporphous hydrogenated silicon devices", Solid-State Electronics, 2000, pp. 17-27, vol. 44, Elsevier Science Ltd.
Jian Hu et al., "Switching and filament formation in hot-wire CVD p-type a-Si:H devices", Thin Solid Films, Science Direct, www.sciencedirect.com, 2003, pp. 249-252, vol. 430, Elesevier Science B.V.
S. Hudgens et al., "Overview of Phase-Change Chalcogenide Nonvolatile Memory Technology", MRS Bulletin, www.mrs.org/publications/bulletin, Nov. 2004, pp. 829-832.
K. Terabe et al., "Quantized conductance atomic switch", Nature, www.nature.com/nature, Jan. 6, 2005, pp. 47-50, vol. 433, Nature Publishing Group.
Michael Kund et al., "Conductive bridging RAM (CBRAM): An emerging non-volatile memory technology scalable to sub 20nm", IEEE, 2005.
W. Den Boer, "Threshold switching in hydrogenated amorphous silicon", Appl. Phys. Letter, 1982, pp. 812-813, vol. 40, American Institute of Physics.
P.G. Lecomber et al., "The Switching Mechanism in Amorphous Silicon Junctions", Journal of Non-Crystalline Solids, 1985, pp. 1373-1382, vol. 77 & 78, Elsevier Science Publishers B.V., North Hollad physics Publishing Division, North-Holland, Amsterdam.
A. E. Owen et al., "Switching in amorphous devices", INT. J. Electronics, 1992, pp. 897-906, vol. 73, No. 5, Taylor and Francis Ltd.

(56) References Cited

OTHER PUBLICATIONS

M. Jafar et al., "Switching in amorphous-silicon devices", Physical Review B, May 15, 1994, pp. 611-615, vol. 49, No. 19, The American Physical Society.
Alexandra Stikeman, "Polymer Memory—The plastic path to better data storage", Technology Review, www.technologyreview.com, Sep. 2002, pp. 31.
Yong Chen et al., "Nanoscale molecular-switch crossbar circuits", Nanotechnology, 2003, pp. 462-468, vol. 14, Institute of Physics Publishing Ltd.
C. P. Collier et al., "Electronically Configurable Molecular-Based Logic Gates", Science Jul. 16, 1999, pp. 391-395, vol. 285, No. 5426, American Association for the Advancement of Science.
Office Action for U.S. Appl. No. 11/875,541 dated Jul. 22, 2010.
Office Action for U.S. Appl. No. 11/875,541 dated Mar. 30, 2011.
Office Action for U.S. Appl. No. 11/875,541 dated Oct. 5, 2011.
Office Action for U.S. Appl. No. 11/875,541 dated Jun. 8, 2012.
Jang Wook Choi, "Bistable [2]Rotaxane Based Molecular Electronics: Fundamentals and Applicaitons", Dissertation, Chapter 3, <http://resolver.caltech.edu/CaltechETD:etd-05242007-194737> 2007, pp. 79-120, California Institute of Technology, Pasadena.
Sung-Hyun Jo et al., "A Silicon-Based Corssbar Ultra-High-Density Non-Volatile Memory", SSEL Annual Report 2007.
International Search Report for PCT/US2009/060023 filed on Oct. 8, 2009.
Rainer Waser et al., "Nanoionics-based resistive switching memories", Nature Materials, Nov. 2007, pp. 833-835, vol. 6, Nature Publishing Group.
Written Opinion of the International Searching Authority for PCT/US2009/060023 filed on Oct. 8, 2009.
Ex parte Quayle Action for U.S. Appl. No. 12/826,653 dted May 8, 2012.
International Search Report for PCT/US2011/040090 filed on Jun. 10, 2011.
Written Opinion of the International Searching Authority for PCT/US2011/040090 filed on Jun. 10, 2011.
Notice of Allowance for U.S. Appl. No. 13/158,231 dated Apr. 17, 2012.
Office Action for U.S. Appl. No. 12/835,704 dated Sep. 21, 2011.
Office Action for U.S. Appl. No. 12/835,704 dated Mar. 1, 2012.
Advisory Action for U.S. Appl. No. 12/835,704 dated Jun. 8, 2012.
International Search Report and Written Opinion for PCT/US2011/046035 filed on Jul. 29, 2011.
Office Action for U.S. Appl. No. 12/861,650 dated Jan. 25, 2012.
Notice of Allowance for U.S. Appl. No. 12/861,650 dated Jun. 19, 2012.
Sung Hyun Jo et al., "Programmable Resistance Switching in Nanoscale Two-Terminal Devices," Supporting Information, pp. 1-4.
Kuk-Hwan Kim et al., "Nanoscale resistive memory with intrinsic diode characteristics and long endurance," Applied Physics Letters, 2010, pp. 053106-1-053106-3, vol. 96, American Institute of Physics.
Sung Hyun Jo et al., "Si-Based Two-Terminal Resistive Switching Nonvolatile Memory", IEEE, 2008.
Sung Hyun Jo et al., "Nanoscale Memristor Device as Synapse in Neuromorphic Systems", Nano Letters, pubs.acs.org/NanoLett, pp. A-E, American Chemical Society Publications.
Wei Lu et al., "Nanoelectronics from the bottom up", Nature Materials, www.nature.com/naturematerials, Nov. 2007, pp. 841-850, vol. 6, Nature Publishing Group.
Sung Hyun Jo et al., "Ag/a-Si:H/c-Si Resistive Switching Nonvolatile Memory Devices", Nanotechnology Materials and Devices Conference, IEEE, 2006, pp. 116-117, vol. 1.
Sung Hyun Jo et al., "Experimental, Modeling and Simulation Studies of Nanoscale Resistance Switching Devices", 9th Conference on Nanotechnology, IEEE, 2009, pp. 493-495.
Sung Hyun Jo et al., "Nonvolatile Resistive Switching Devices Based on Nanoscale Metal/Amorphous Silicon/Crystalline Silicon Junctions", Mater. Res. Soc. Symp. Proc., 2007, vol. 997, Materials Research Society.
Sung Hyun Jo et al., "Si Memristive Devices Applied to Memory and Neuromorphic Circuits", Proceedings of 2010 IEEE International Symposium on Cirsuits and Systems, 2010, pp. 13-16.
Wei Lu et al., "Supporting Information", 2008.
Sung Hyun Jo et al., "High-Density Crossbar Arrays Based on a Si Memristive System", Nano Letters, 2009, pp. 870-874, vol. 9, No. 2, American Chemical Society Publications.
Sung Hyun Jo et al., "High Density Corssbar Based on a Si Memristive System", Supporting Information. 2009, pp. 1-4.
Sung Hyun Jo et al., "Programmable Resistance Switching in Nanoscale Two-Terminal Devices", Nano Letters, 2009, pp. 496-500, vol. 9 No. 1, American Chemical Society Publications.
Shubhra Gangopadhyay et al., "Memory Switching in Sputtered Hydrogenated Amorphous Silicon (a-Si:H)", Japanese Journal of Applied Physics, Short Notes, 1985, pp. 1363-1364, vol. 24 No. 10.
S. K. Dey, "Electrothermal model of switching in amorphous silicon films", J. Vac. Sci. Technol., Jan./Feb. 1980, pp. 445-448, vol. 17, No. 1, American Vacuum Society.
J. Hajto et al., "The Programmability of Amorphous Silicon Analogue Memory Elements", Mat. Res. Soc. Symp. Proc., 1990, pp. 405-410, vol. 192, Materials Research Society.
M. J. Rose et al., "Amorphous Silicon Analogue Memory Devices", Journal of Non-Crystalline Solids, 1989, pp. 168-170, vol. 115, Elsevier Science Pbulishers B.V., North-Holland.
A. Moopenn et al., "Programmable Synaptic Devices for Electronic Neural Nets", Control and Computers, 1990, pp. 37-41, vol. 18 No. 2.
P.G. Le Comber, "Present and Future Applicaitons of Amorphous Silicon and Its Alloys", Journal of Non-Crystalline Solids, 1989, pp. 1-13, vol. 115, Elsevier Science Publishers B.V., North-Holland.
J. Hu, et al., "AC Characteristics of $Cr/p^{30}$a-Si:H/V Analog Switching Devices", IEEE Transactions on Electron Devices, Sep. 2000, pp. 1751-1757, vol. 47 No. 9, IEEE.
A.E. Owen et al., "New amorphous-silicon electrically programmable nonvolatile switching device", Solid-State and Electron Devices, IEEE Proceedings, Apr. 1982, pp. 51-54, vol. 129, Pt. I., No. 2.
J. Hajto et al., "Electronic Switching in Amorphous-Semiconductor Thin Films", Chapter 14, pp. 640-701.
J. Hajto et al., "Analogue memory and ballistic electron effects in metal-amorphous silicon structures", Philsophical Magazine B, 1991, pp. 349-369, vol. 63 No. 1, Taylor & Francis Ltd.
A. J. Holmes et al., "Design of Analogue Synapse Circuits using Non-Volatile a-Si:H Memory Devices", pp. 351-354.
Yajie Dong et al., "Si/a-Si Core/Shell Nanowires as Nonvolatile Crossbar Switches", Nano Letters, Jan. 2008, pp. 386-391, vol. 8 No. 2, American Chemical Society.
European Search Report for Application No. EP 09 81 9890.6 of Mar. 27, 2012.
D. A. Muller et al., "The Electronic structure at the atomic scale of ultrathin gate oxides", Nature, Jun. 24, 1999, pp. 758-761, vol. 399.
J. Suñé et al., "Nondestructive multiple breakdown events in very thin $SiO_2$ films", Applied Physics Letters, 1989, pp. 128-130, vol. 55.
Herve Marand et al., MESc. 5025 lecture notes: Chapter 7. Diffusion, University of Vermont, http://www.files.chem.vt.edu/chem-dept/marand/MEScchap6-1c.pdf.
A. E. Owen et al., "Electronic Switching in Amorphous Silicon Devices: Properties of hte Conducting Filament", Proceedings of 5th International Conference on Solid-State and Integrated Circuit Technology, IEEE, 1998, pp. 830-833.
Sung Hyun Jo, "Nanoscale Memristive Devices for Memory and Logic Applications", Ph. D dissertation, Univertisy of Michigan, 2010.
Office Action for U.S. Appl. No. 12/894,098 dated Aug. 1, 2012.
Sung Hyun Jo et al., "CMOS Compatible Nanoscale Nonvolatile Resistance Switching Memory", Nano Letters, 2008, pp. 392-397, vol. 8, No. 2.
Office Action for U.S. Appl. No. 12/582,086 dated Apr. 19, 2011.
Office Action for U.S. Appl. No. 12/582,086 dated Sep. 6, 2011.
Notice of Allowance for U.S. Appl. No. 12/582,086 dated Oct. 21, 2011.
International Search Report for PCT/US2009/061249 filed on Oct. 20, 2009.

(56) References Cited

OTHER PUBLICATIONS

Written Opinion of the International Searching Authority for PCT/US2009/061249 filed on Oct. 20, 2009.
Office Action for U.S. Appl. No. 12/814,410 dated Apr. 17, 2012.
Office Action for U.S. Appl. No. 12/835,699 dated Aug. 24, 2011.
Notice of Allowance for U.S. Appl. No. 12/835,699 dated Feb. 6, 2012.
Office Action for U.S. Appl. No. 12/833,898 dated Apr. 5, 2012.
European Search Report for Application No. EP 1100 5207.3 of Oct. 12, 2011.
Notice of Allowance for U.S. Appl. No. 12/833,898 dated May 30, 2012.
Notice of Allowance for U.S. Appl. No. 12/939,824 dated May 11, 2012.
Notice of Allowance for U.S. Appl. No. 12/940,920 dated Oct. 5, 2011.
Office Action for U.S. Appl. No. 13/314,513 dated Mar. 27, 2012.
Shong Yin, "Solution Processed Silver Sulfide Thin Films for Filament Memory Applications", Technical Report No. UCB/EECS-2010-166, http://www.eecs.berkeley.edu/Pubs/TechRpts/2010/EECS-2010-166.html, Dec. 17, 2010, Electrical Engineering and Computer Sciences, University of California at Berkeley.
Office Action for U.S. Appl. No. 13/149,653 dated Apr. 25, 2012.
International Search Report for PCT/US2011/045124 filed on Jul. 22, 2011.
Written Opinion of the International Searching Authority for PCT/U52011/045124 filed on Jul. 22, 2011.
Peng-Heng Chang et al., "Aluminum spiking at contact windows in Al/Ti-W/Si", Appl. Phys. Lett., Jan. 25, 1988, pp. 272-274, vol. 52 No. 4, American Institute of Physics.
J. Del Alamo et al., "Operating Limits of Al-Alloyed High-Low Junctions for BSF Solar Cells", Solid-State Electronics, 1981, pp. 415-420, vol. 24, Pergamon Press Ltd., Great Britain.
Hao-Chih Yuan et al., "Silicon Solar Cells with Front Hetero-Contact and Aluminum Alloy Back Junction", NREL Conference Paper CP-520-42566, 33rd IEEE Photovoltaic Specialists Conference, May 11-16, 2008, National Renewable Energy Laboratory, San Diego, California.
Notice of Allowance for U.S. Appl. No. 12/939,824 dated Jul. 24, 2012.
Notice of Allowance for U.S. Appl., No. 13/733,828, dated Aug. 8, 2013.
Notice of Allowance for U.S. Appl. No. 12/814,410, dated Jan. 8, 2013.
Corrected Notice of Allowance for U.S. Appl. No. 12/861,666, dated Jan. 11, 2013.
Supplemental Notice of Allowance for U.S. Appl. No. 12/894,087, dated Jan. 11, 2013.
Notice of Allowance for U.S. Appl. No. 13/314,513, dated Jan. 24, 2013.
Notice of Allowance for U.S. Appl. No. 13/118,258, dated Feb. 6, 2013.
International Search Report and Written Opinion for PCT/US2012/040242, filed May 31, 2012.
Office Action for U.S. Appl. No. 13/174,264, dated Mar. 6, 2013.
Office Action for U.S. Appl. No. 13/679,976, dated Mar. 6, 2013.
Notice of Allowance for U.S. Appl. No. 12/894,098, dated Mar. 15, 2013.
Office Action for U.S. Appl. No. 13/465,188, dated Mar. 19, 2013.
Office Action for U.S. Appl. No. 12/861,432, dated Mar. 29, 2013.
Notice of Allowance for U.S. Appl. No. 13/748,490, dated Apr. 9, 2013.
Office Action for U.S. Appl. No. 13/725,331, dated May 20, 2013.
International Search Report and Written Opinion for PCT/US2012/045312, filed on Jul. 2, 2012.
Office Action for U.S. Appl. No. 13/466,008, dated Jul. 29, 2013.
Russo, Ugo et al., "Self-Accelerated Thermal Dissolution Model for Reset Programming in Unipolar Resistive-Switching Memory (RRAM) Devices", IEEE Transactions on Electron Devices, Feb. 2009, pp. 193-200, vol. 56, No. 2.
Cagli, C. et al., "Evidence for threshold switching in the set process of NiO-based RRAM and physical modeling for set, reset, retention and disturb prediction", IEEE International Electron Devices Meeting, Dec. 15-17, 2008, pp. 1-4, San Francisco, CA.
Office Action for U.S. Appl. No. 13/077,941, dated Aug. 12, 2013.
Office Action for U.S. Appl. No. 13/436,714, dated Aug. 27, 2013.
Notice of Allowance for U.S. Appl. No. 13/679,976, dated Sep. 17, 2013.
Office Action for U.S. Appl. No. 13/189,401, dated Sep. 30, 2013.
Office Action for U.S. Appl. No. 13/462,653, dated Sep. 30, 2013.
Corrected Notice of Allowance for U.S. Appl. No. 13/733,828, dated Oct. 1, 2013.
Notice of Allowance for U.S. Appl. No. 13/733,828, dated Aug. 8, 2013.
Office Action for U.S. Appl. No. 13/594,665, dated Aug. 2, 2013.
Notice of Allowance for U.S. Appl. No. 13/769,152, dated Oct. 8, 2013.
Notice of Allowance for U.S. Appl. No. 13/905,074, dated Oct. 8, 2013.
Notice of Allowance for U.S. Appl. No. 13/452,657, dated Oct. 10, 2013.
Notice of Allowance for U.S. Appl. No. 13/174,264, dated Oct. 16, 2013.
Notice of Allowance for U.S. Appl. No. 13/417,135, dated Oct. 23, 2013.
Notice of Allowance for U.S. Appl. No. 13/725,331, dated Jan. 17, 2014.
Office Action for U.S. Appl. No. 13/739,283, dated Jan. 16, 2014.
Office Action for U.S. Appl. No. 13/920,021, dated Jan. 10, 2014.
Office Action for U.S. Appl. No. 12/861,432, dated Jan. 8, 2014.
Office Action for U.S. Appl. No. 13/586,815, dated Jan. 29, 2014.
International Search Report and Written Opinion for PCT/US2013/061244, filed on Sep. 23, 2013.
Office Action for U.S. Appl. No. 13/434,567, dated Feb. 6, 2014.
Office Action for U.S. Appl. No. 13/620,012, dated Feb. 11, 2014.
Notice of Allowance for U.S. Appl. No. 13/468,201, dated Feb. 20, 2014.
Office Action for U.S. Appl. No. 12/625,817, dated Feb. 28, 2014.
Office Action for U.S. Appl. No. 12/835,704, dated Mar. 14, 2014.
Office Action for U.S. Appl. No. 13/870,919, Dated Apr. 3, 2014.
Office Action for U.S. Appl. No. 13/167,920, dated Mar. 12, 2014.
International Search Report and Written Opinion for PCT/US2013/077628, filed on Dec. 23, 2013.
Office Action for U.S. Appl. No. 13/705,082, dated Sep. 2, 2014.
Notice of Allowance for U.S. Appl. No. 13/761,132, dated Sep. 4, 2014.
Notice of Allowance for U.S. Appl. No. 13/620,012, dated Sep. 9, 2014.
Notice of Allowance for U.S. Appl. No. 13/870,919, dated Sep. 9, 2014.
Office Action for U.S. Appl. No. 13/739,283, dated Sep. 11, 2014.
Office Action for U.S. Appl. No. 13/756,498, dated Sep. 12, 2014.
Notice of Allowance for U.S. Appl. No. 13/462,653 dated Sep. 17, 2014.
Notice of Allowance for U.S. Appl. No. 13/586,815, dated Sep. 18, 2014.
Notice of Allowance for U.S. Appl. No. 13/920,021, dated Sep. 18, 2014.
Office Action for U.S. Appl. No. 13/189,401, dated Sep. 22, 2013.
Notice of Allowance for U.S. Appl. No. 13/594,665 dated Sep. 26, 2014.
Notice of Allowance for U.S. Appl. No. 13/077,941, dated Oct. 8, 2014.
Notice of Allowance for U.S. Appl. No. 13/077,941, dated Aug. 27, 2014.

* cited by examiner

RESISTIVE MEMORY DEVICE AND FABRICATION METHODS

CROSS-REFERENCE TO RELATED CASES

The present invention claims priority to and is a non-provisional of Ser. No. 61/620,561 filed Apr. 5, 2012. That application is herein by incorporated by reference for all purposes.

BACKGROUND

The present invention relates to memory devices. More particularly, the present invention discloses non-volatile resistive switch memory devices having improved operational characteristics, fabrication techniques, as well as apparatus including such memories.

The inventor of the present invention has recognized the success of semiconductor devices has been mainly driven by an intensive transistor down-scaling process. However, as field effect transistors (FETs) approach sizes less than 100 nm, physical problems such as short channel effect begin to hinder proper device operation. For transistor based memories, such as those commonly known as Flash memories, other performance degradations or problems may occur as device sizes shrink. With Flash memories, a high voltage is usually required for programming of such memories, however, as device sizes shrink, the high programming voltage can result in dielectric breakdown and other problems. Similar problems can occur with other types of non-volatile memory devices other than Flash memories.

The inventor of the present invention recognizes that many other types of non-volatile random access memory (RAM) devices have been explored as next generation memory devices, such as: ferroelectric RAM (Fe RAM); magneto-resistive RAM (MRAM); organic RAM (ORAM); phase change RAM (PCRAM); and others.

A common drawback with these memory devices include that they often require new materials that are incompatible with typical CMOS manufacturing. As an example of this, Organic RAM or ORAM requires organic chemicals that are currently incompatible with large volume silicon-based fabrication techniques and foundries. As another example of this, Fe-RAM and MRAM devices typically require materials using a high temperature anneal step, and thus such devices cannot be normally be incorporated with large volume silicon-based fabrication techniques.

Additional drawbacks with these devices include that such memory cells often lack one or more key attributes required of non-volatile memories. As an example of this, Fe-RAM and MRAM devices typically have fast switching (e.g. "0" to "1") characteristics and good programming endurance, however, such memory cells are difficult to scale to small sizes. In another example of this, for ORAM devices reliability of such memories is often poor. As yet another example of this, switching of PCRAM devices typically includes Joules heating and undesirably require high power consumption.

From the above, improved semiconductor memory devices that can scale to smaller dimensions with reduced drawbacks are therefore desirable.

BRIEF SUMMARY OF THE PRESENT INVENTION

The present invention relates to memory devices. More particularly, embodiments according to the present invention disclose memory (e.g. switching) devices having improved data retention characteristics and methods for forming such devices. Embodiments are described with respect to non-volatile memory devices, however, embodiments may also be applied to a broader range of memory devices, processing devices, and the like.

Various processes include fabrication of a resistive memory device. One process includes forming a conductive silicon layer, such as a p-doped polysilicon or silicon/germanium alloy, in electrical contact and above a first metal layer (e.g. aluminum). The conductive silicon layer is then subject to a plasma etch or ion implantation step (e.g. Argon, Oxygen, Silicon), that changes an upper region of the conductive silicon layer into an amorphous layer. The non-conductive amorphous layer may include oxygen, non-crystalline silicon, silicon dioxide, and p-type impurities, but is relatively non-conductive.

In some specific examples, when the conductive silicon layer is a doped polysilicon material, the amorphization process creates an amorphous material, such as SiOx as a resistive switching layer. In other specific examples, when the conductive silicon layer is a doped silicon-germanium material, the amorphization process creates a SixGeyOz (x, y, z integers) material as a resistive switching material. In some examples, the resulting resistive switching material may have a thickness in the range of approximately 2 nm to approximately 5 nm. In other embodiments, other thicknesses are contemplated, in light of the specific engineering requirements.

Subsequently, an active metal layer (e.g. silver, platinum, palladium, copper, nickel, or the like) is disposed above the upper region (now amorphous layer). One or more second metal layers (e.g. aluminum) may be formed in electrical contact with the active metal layer. A resistive memory device is formed from a lower region of the conductive silicon layer, the non-conductive amorphous layer, and the active metal layer.

In various embodiments, a processor, or the like, may include resistive memories as described herein. Because the resistive memories are relatively non-volatile, the resistive states of devices, such as processors, or the like may be maintained while power is not supplied to the processors. To a user, such capability would greatly enhance the power-on power-off performance of devices including such processors. Additionally, such capability would greatly reduce the power consumption of devices including such processors. In particular, because such memories are non-volatile, the processor need not draw power to refresh the memory states, as is common with CMOS type memories. Accordingly, embodiments of the present invention are directed towards processors or other logic incorporating these memory devices, as described herein, devices (e.g. smart phones, network devices) incorporating such memory devices, and the like.

According to one aspect of the invention, a semiconductor fabrication method for forming a resistive memory device is disclosed. One technique includes providing a substrate comprising a first metal material, and forming a conductive silicon-bearing layer on top of the first metal material, wherein the conductive silicon-bearing layer comprises an upper region and a lower region, and wherein the lower region is adjacent to the first metal material. A process includes forming an amorphous layer from the upper region of the conductive silicon-bearing layer, and disposing an active metal material above the amorphous layer.

According to another aspect of the invention, a resistive memory device is described. One device includes a substrate comprising a first metal material, and a monolithic semiconductor layer formed on the first metal material, wherein the monolithic semiconductor layer comprises an upper region and a lower region, wherein the lower region of the monolithic semiconductor layer comprises a conductive silicon-bearing material, and wherein the upper region of the monolithic semiconductor layer comprises a conductive silicon-bearing material subjected to an Argon plasma etch, and wherein the lower region is adjacent to the first metal material. In a device an active metal material disposed above the upper region.

According to yet another aspect of the invention, a resistive memory device formed according to the processes disclosed herein.

SUMMARY OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DETAILED DESCRIPTION OF THE PRESENT INVENTION

The present invention is generally related to a memory (switching) device and an apparatus including a memory device. More particularly, embodiments of the present invention provide structures and a methods for forming one or more resistive switching/memory devices each having improved memory retention characteristics. The embodiments described herein are described with respect to fabrication of high density non-volatile memory devices. However, one of ordinary skill in the art will recognize that these devices may be applied to a broad range of applications, such as processing devices, computing devices, or the like.

Figure 1:
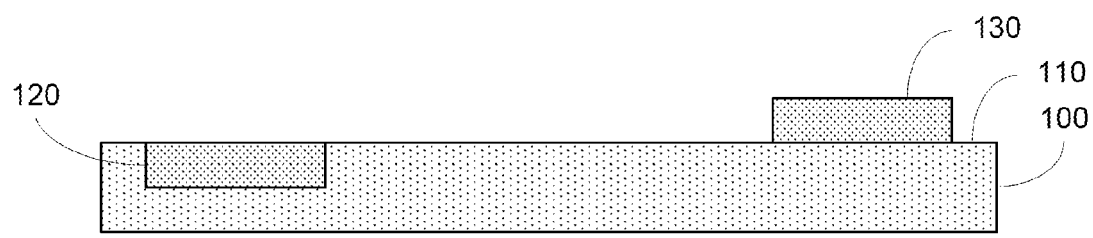
FIG. 1 illustrates a cross-section of a process step for forming a switching device according to various embodiments of the present invention.

FIG. 1 illustrates a substrate 100 having a surface region 110. In various embodiments, the substrate 100 can be a semiconductor substrate, such as: a single crystal silicon wafer, a silicon germanium wafer, a silicon-on-insulator substrate, commonly known as SOI, and the like.

Depending on the specific embodiment, the processes described herein are back-end CMOS processes, i.e. processes limited to certain temperature ranges, and the like, that can be performed upon substrates having existing CMOS devices. Accordingly, the substrate 100 may include one or more transistor devices, conductors, or the like, formed below (e.g. 120) surface region 110, or next to surface region 110 (e.g. 130). In some embodiments, the CMOS devices 120 or 130 may include device drivers controlling circuitry for the resistive switching device; processing or computational logic; physical sensors; memories, or the like. In various embodiments, the one or more resistive switching/memory devices formed herein may be operationally coupled to the CMOS devices 120 or 130.

Figure 2:
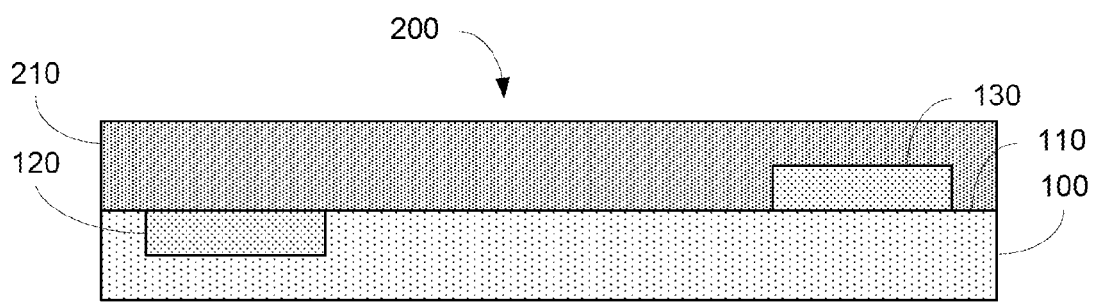
FIG. 2 illustrates a cross-section of process step for forming a switching device according to various embodiments of the present invention.

FIG. 2 illustrates a resulting cross-section 200 after a first dielectric material 210 is disposed overlying the surface region 110 of the semiconductor substrate 100. The first dielectric material 210 can be a suitable dielectric material such as silicon oxide, silicon nitride or combinations thereof depending on the embodiment. In various embodiments, the first dielectric material 210 can be deposited using conventional processing techniques such as plasma enhanced chemical vapor deposition; low pressure chemical vapor deposition; or the like depending on engineering requirements. In some examples, silicon oxide may be formed using silane, disilane, a suitable chlorosilane or TEOS, or other suitable silicon bearing materials, depending on the embodiment.

Figure 3:
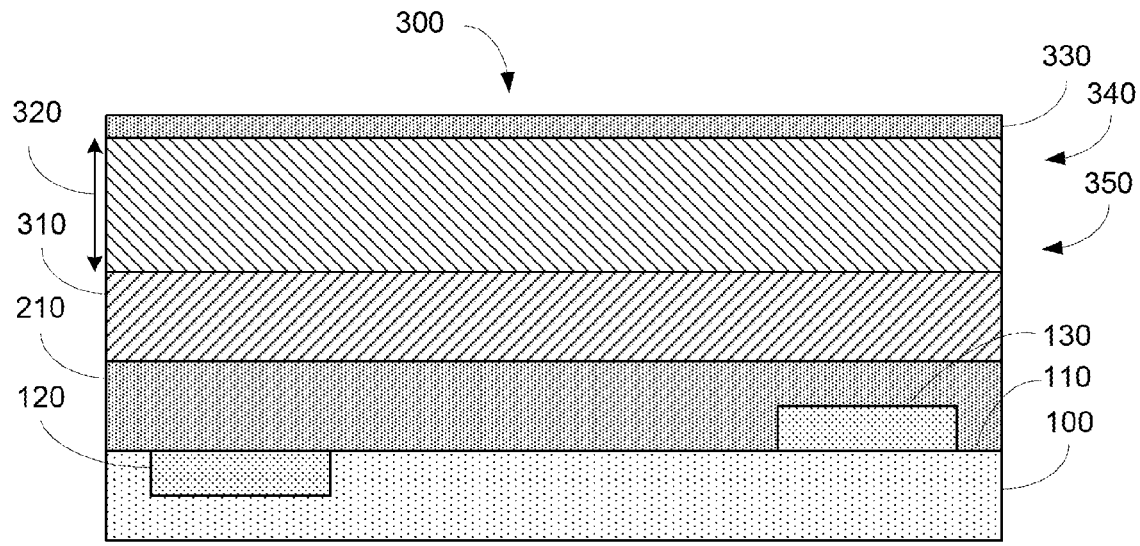
FIG. 3 illustrates a cross-section of a process step for forming a switching device according to various embodiments of the present invention.

FIG. 3 illustrates a cross-section 300 after a first wiring material 310 is disposed overlying the first dielectric material 210. In various embodiments, the first wiring material 310 may be tungsten, copper, aluminum or other suitable metal materials including alloys thereof. In various embodiments, the first wiring material 310 can be deposited using conventional processing techniques including: physical vapor deposition, evaporation, chemical vapor deposition, or the like; electrochemical methods such as electroplating or electrodeless deposition from a liquid medium, or the like; or other suitable deposition techniques including combinations of the above. In some embodiments, first wiring material 310 may be patterned. Additionally, one or more bather materials/contact materials may be disposed on first wiring material 310 before or after patterning.

In some embodiments of the present invention, a conductive silicon-bearing material 320 may be disposed over the first wiring material 310. In some embodiments of the present invention, conductive material 320 may be a polysilicon, a p-type doped polysilicon, a silicon/germanium alloy or the like. Various methods may be used to dope the polysilicon, including in-situ dopants, ion implantation, and the like. The p-type dopant may be any conventional dopant in various embodiments, such as Boron, or the like. In some embodiments, the thickness of the silicon-bearing material 320 may be within the range of about 3 nm to about 10 nm, or the like. An upper region 340 and a lower region 350 are illustrated.

In some embodiments of the present invention, before conductive silicon layer 320 is formed, a thick dielectric layer, e.g. an oxide layer, may be formed above first wiring material 310. Then a series of vias are etched into the thick oxide layer to expose first wiring material 310. In such cases, the conductive silicon material 320 is formed within the via structures.

In various embodiments, after or when the conductive silicon-bearing material, e.g. doped polysilicon layer is being formed, a thin layer 330 of material may be formed on the top surface of conductive material 320. This growth may be a natural process that occurs between processing steps, or this growth may be intentional performed. In some embodiments, the thickness of the may be controlled. In other words, an etch process (e.g. HF dip, or the like) may be performed to either completely remove the layer before subsequent processes are performed, or the thickness of the layer may brought within a certain thickness range. In some embodiments, the thickness of the layer may be on the order of 0 to 50 angstroms. In some embodiments, the within the device, the thin layer 330 is an oxide, nitride, or the like.

Figure 4:
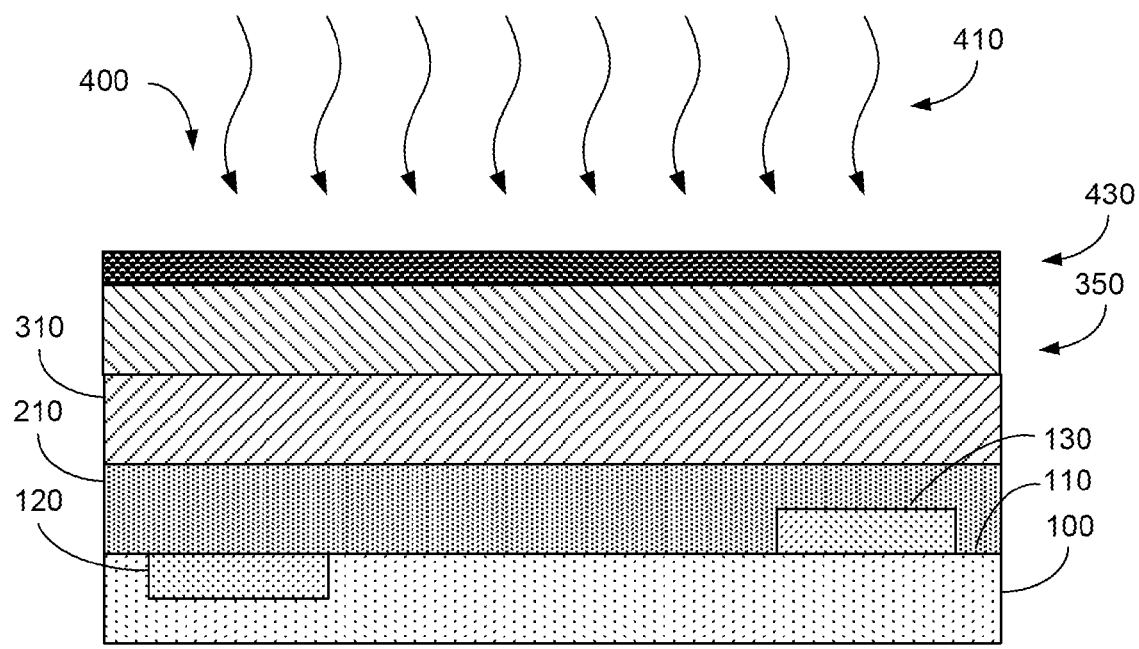
FIG. 4 illustrates a cross-section of a process step for forming a switching device according to various embodiments of the present invention.

FIG. 4 illustrates a cross-section 400 according to embodiments of the present invention. In FIG. 4, the top surface of the device illustrated in FIG. 3 is subject to an Argon gas plasma etch 410 with a bias power within a range of approximately 30 watts to approximately 120 watts. In other embodiments, the plasma etch may use oxygen, silicon, another noble gas, or the like.

In some embodiments of the present invention, an ion implantation process is performed instead of/or in addition to the plasma etch. The implantation may use Argon-ions or the like. In some embodiments, implantation energy may be within the range 10 to 200 keV.

As illustrated in FIG. 4, upper region 340 of conductive material 320 is affected by the plasma etch/ion implant. In various embodiments, it is believed that the result of the etch/implant is an amorphizing of the conductive silicon material within upper region 410. In other words, a portion of the conductive silicon material within upper region 340 is etched away, and a portion becomes non-conductive, i.e. amorphous silicon layer 430. Although amorphous silicon 430 may still include p-type dopants, the amorphous silicon is non-crystalline, and is non-conductive.

In some specific examples, when conductive material 320 is a doped polysilicon material, the amorphization process creates an amorphous SiOx material. In other specific examples, when conductive material 320 is a doped silicon-germanium material, the amorphization process creates SiOx and/or a SixGeyOz (x, y, z integers) material as the amorphous layer. In some examples, the upper region 410 may have a thickness in the range of approximately 2 nm to approximately 5 nm. In other embodiments, other thicknesses are contemplated, in light of the specific engineering requirements. As will be described below, the amorphous silicon 430 in upper region 340 serves as a resistive switching layer.

In some embodiments, where a via structure is used, conductive material 320 may be planarized with respect to a thick dielectric layer, e.g. an oxide layer, prior to the amorphizing process described above. After amorphizing, the amorphous silicon 430 is exposed for the following steps.

In some embodiments, a pillar-type structure is used. In such embodiments, the amorphous silicon 430 and the lower region 350 may be etched to form a series of pillar-type structures overlying first wiring layer 310. In such embodiments, a thick dielectric layer is formed over and between the pillar-type structures, and one or more CMP processes may be performed to expose a top surface of amorphous silicon 430 for the following steps.

In some embodiments, amorphous silicon 430 (the amorphous layer) has a thickness within the range of approximately 2 to approximately 10 nanometers, approximately 30 Angstroms to approximately 40 Angstroms, or the like depending upon specific device engineering requirements or design. In some embodiments, a thickness of lower region 350 is typically greater than a thickness of upper region 340.

In some experimental studies, where an oxide layer 330 is present, oxide layer 330 above upper region 340 disappears, and an atomic composition of amorphous silicon 430 reveals primarily silicon and oxygen. In various embodiments, amorphous silicon 430 is the switching material for this device.

Figure 5:
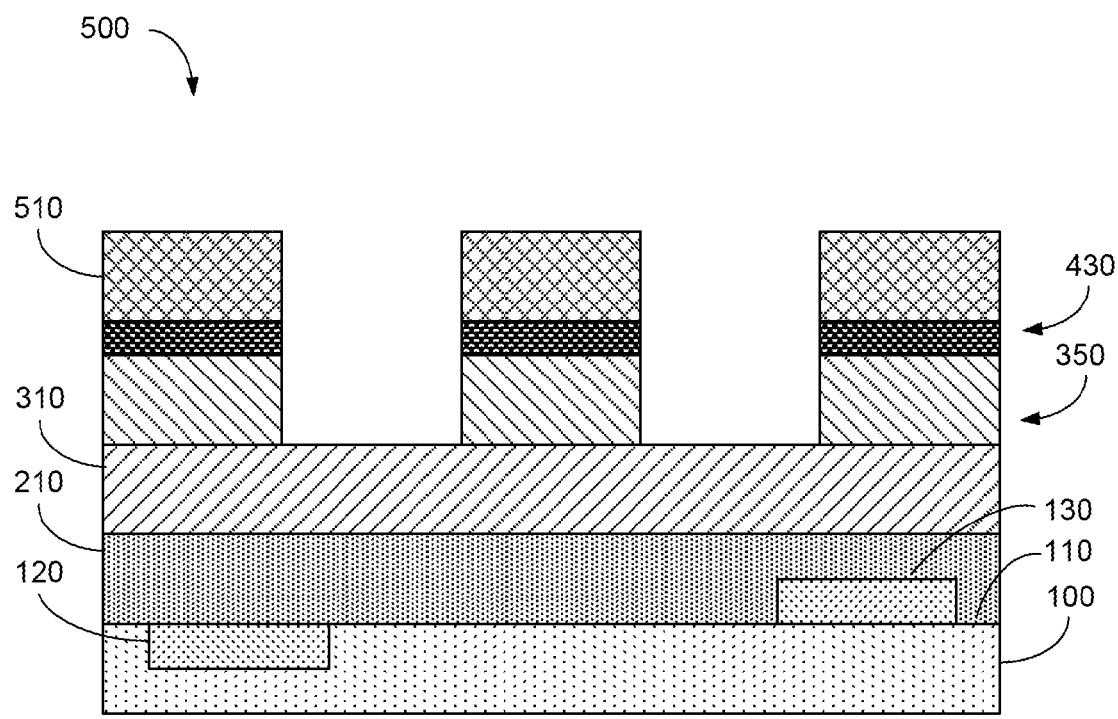
FIG. 5 illustrates a cross-section of a process step for forming a switching device according to various embodiments of the present invention.

FIG. 5 illustrates a cross-section 500 according to various embodiments of the present invention. More specifically, as illustrated in FIG. 5, a conductive material 510 is disposed above amorphous silicon 430. In a specific embodiment, for amorphous silicon switching material, conductive material 510 can comprise a silver material, and in other embodiments, materials including silver, platinum, palladium, copper or nickel, or a combination may be used for conductive material.

Conductive material 510 can be deposited using a physical deposition process such as sputtering or evaporation. Conductive material 510 (e.g. silver) may also be formed using a chemical deposition process such as chemical vapor deposition, electrochemical such as electroplating, electrodeless deposition, or a combination depending on the application.

In some embodiments, a thin layer of material may be present prior to the deposition of conductive material 510. This thin layer may be within the range of approximately 5 nm to approximately 25 Angstroms, approximately 40 A to 30 A, approximately 30 A, or the like. In some embodiments, the thin layer serves to reduce the diffusion or agglomeration of conductive material 510 (e.g. silver) into switching material 430 during fabrication of the disclosed structures. In such embodiments, as back end fabrication steps may include high temperature operations, the thin layer reduces the migration of the metallic ions into the switching material 430. In some embodiments, the thin layer also serves to restrict or control where metallic ions migrate into switching material 430 during operation of the device. As disclosed in co-pending U.S. patent application Ser. No. 12/894,098, filed Sep. 29, 2010, assigned to the same assignee, and incorporated by reference herein, for all purposes, during operation of the device, a thin oxide layer is used to control a conductive path from a metallic layer to the switching layer.

In various embodiments of the present invention, the thin layer may be a layer of oxide, carbon, nitride or other relative stable material. These materials may be formed via a plasma enhanced chemical vapor deposition process, an atomic layer deposition process, a spin coating process, a plasma oxidation process, a physical vapor deposition process, a naturally occurring growth, or the like. In some embodiments, the formed oxide may be subsequently etched until the desired thickness is obtained for the thin layer. In some examples, an Argon etch may be used. In some embodiments, the conductive material 510 is thus formed or deposited on top of the thin layer that is specifically grown, formed, deposited, or naturally occurring upon switching material 430.

In various embodiments, one or more barrier/contact materials may be formed overlying the conductive material 510. In some examples, barrier/contact materials protect conductive material 510 from oxidation, serve as a polish stop material in a subsequent step for a CMP process, or the like. In some embodiments, barrier/contact material can be titanium, titanium nitride, tantalum or tantalum nitride, tungsten, or tungsten nitride, or any suitable barrier material and can be formed using a chemical deposition such as atomic layer deposition, chemical vapor deposition, and others, or a physical deposition such as sputtering, depending on the application.

In a specific embodiment, an embodiment may include subjecting a stack of material comprising one or more barrier/contact materials, amorphous material 430, lower region 420, conductive material 510, and/or one or more barrier/contact materials to a patterning and etch process to form a plurality of pillar structures above first wiring material 310. The shape of the cross section shape of pillar structures may be approximately square, rectangular, circular, hexagonal, or other similar shape. Within the pillar structures, lower region 420, amorphous material 430, and conductive material 510 form the switching device. In various embodiments, the pillar structures can have a feature size of less than about 250 nm and preferably about 90 nm, or even 40 nm, depending on the technology node adopted. The first wiring layer 310 structure can have a width of about 90 nm or greater. Subsequently, in some embodiments, a thick dielectric is deposited to laterally isolate the pillar structures, and one or more planarization processes are performed to expose a top surface of conductive material 510.

Figure 6:
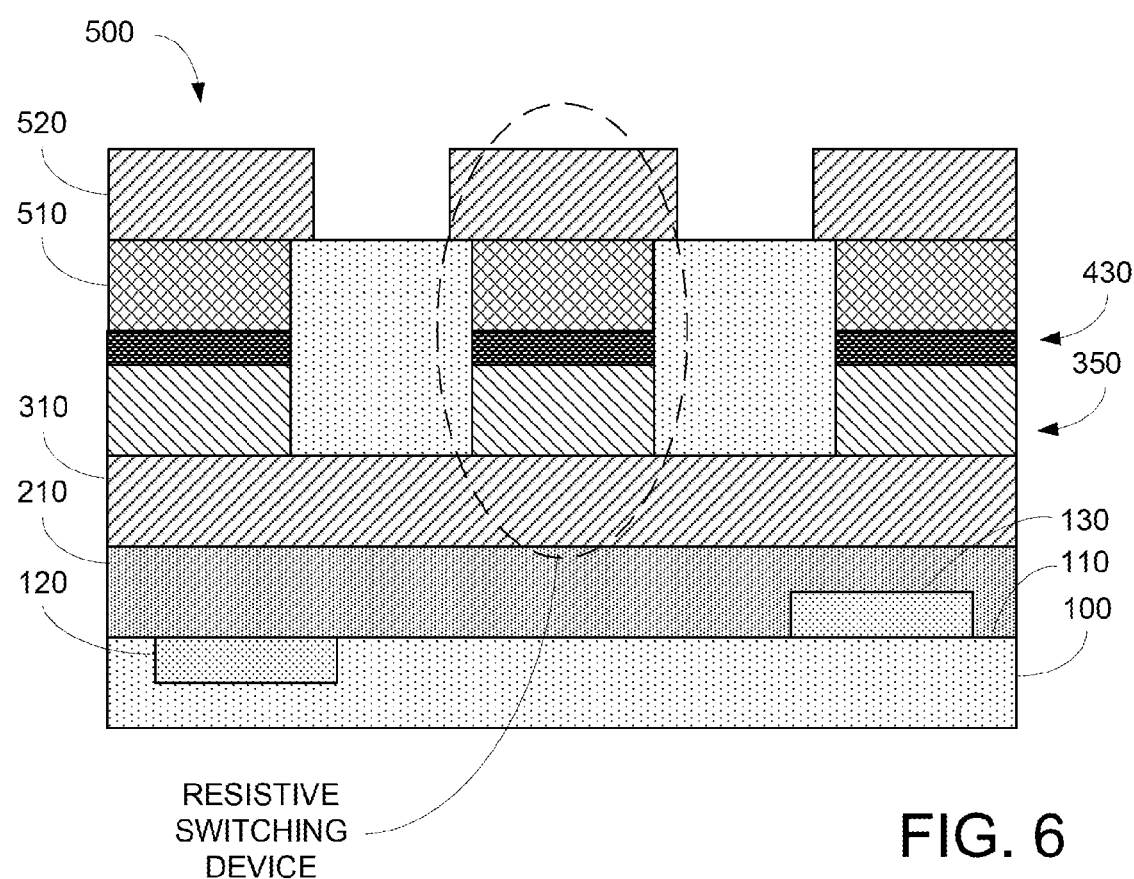
FIG. 6 illustrates a cross-section of an embodiment of the present invention.

FIG. 6 illustrates a cross-section 600 of an embodiment of the present invention. In FIG. 6, in some embodiments, a second wiring material 520 is disposed in electrical contact with conductive material 510 (sometimes with intermediary barrier/contact materials). As can be seen, the pillars of FIG. 5 are electrically isolated (e.g. by an oxide, or the like). In various embodiments, the second wiring material 520 may be tungsten, copper, aluminum or other suitable metal materials including alloys thereof. In various embodiments, the second wiring material 520 can be deposited using conventional processing techniques including: physical vapor deposition, evaporation, chemical vapor deposition, or the like; electrochemical methods such as electroplating or electrode-less deposition from a liquid medium, or the like; or other suitable deposition techniques including combinations of the above. In some embodiments, second wiring material 520 may be patterned. Additionally, one or more barrier materials/contact materials may be disposed on second wiring material 520 before or after patterning, such as tungsten.

In some embodiments, first wiring material 310 is patterned and extends in a first direction and second wiring material 520 is patterned and extends in a second direction. The first direction and the second direction are characterized by an angle between them. In some embodiments the angle may be 90 degrees, 30 degrees, or the like.

In a specific embodiment, the top wiring structure, the bottom wiring structure and the switching element sandwiched between the first wiring structure and the second wiring structure provide for a switching device for a non-volatile memory device. Of course one skilled in the art would recognize other variations, modifications, and alternatives. It is also understood that the examples and embodiments described herein are for illustrative purposes only and that various modifications or alternatives in light thereof will be suggested to persons skilled in the art and are to be included within the spirit and purview of this application and scope of the appended claims.

What is claimed is:

1. A method for forming a resistive memory device comprising:
   providing a substrate comprising a first metal material;
   forming a conductive silicon-bearing layer on top of the first metal material, wherein the conductive silicon-bearing layer comprises an upper region and a lower region, and wherein the lower region is adjacent to the first metal material;
   forming an amorphous layer from the upper region of the conductive silicon-bearing layer; and
   disposing an active metal material above the amorphous layer.

2. The method of claim 1
   wherein a barrier layer is formed on the amorphous layer prior to the disposing the active metal material above the amorphous layer; and
   wherein the barrier layer comprises a nitride layer.

3. The method of claim 1 wherein the barrier layer has a thickness within the range of approximately 20 Angstroms to approximately 50 Angstroms.

4. The method of claim 1
   wherein the active metal material comprises a metal selected from a group consisting of: aluminum, silver, platinum, palladium, copper, and nickel.

5. The method of claim 1 wherein forming the amorphous layer from the upper region comprises: performing an Argon, silicon, and/or oxygen plasma etch on an exposed surface of the conductive silicon-bearing layer.

6. The method of claim 1
   wherein forming the amorphous layer from the upper region comprises: performing an Argon plasma etch on an exposed surface of the conductive silicon-bearing layer; and
   wherein the plasma etch comprises a bias power within a range of approximately 30 watts to approximately 120 watts.

7. The method of claim 1
   wherein forming the amorphous layer from the upper region comprises: performing an ion implantation on the upper region of the conductive silicon-bearing; and
   wherein an ion for the ion implant is selected from a group consisting: Argon, silicon, and oxygen.

8. The method of claim 1 wherein the amorphous layer has a thickness within the range of approximately 2 to approximately 10 nanometers.

9. The method of claim 1 wherein the amorphous layer has a thickness within the range of approximately 30 Angstroms to approximately 40 Angstroms.

10. The method of claim 1
    wherein the conductive silicon-bearing layer comprises $Si_xGe_{x-1}$;
    wherein the conductive silicon-bearing layer comprises a p-type dopant; and
    wherein the amorphous layer comprises a silicon oxide.

11. A method for fabricating a device comprising:
    providing a substrate including a plurality of CMOS devices;
    forming a resistive memory upon the substrate comprising:
    forming a first metal material;
    forming a monolithic conductive silicon-bearing layer on top of the first metal material;
    forming an amorphous silicon and oxygen-bearing layer in a portion of the monolithic conductive silicon-bearing layer; and
    disposing an active metal material above the amorphous silicon and oxygen-bearing layer; and
    coupling the resistive memory to at least one of the plurality of CMOS devices.

12. The method of claim 11 further comprising after the forming the amorphous silicon and oxygen-bearing layer, forming a barrier layer on the portion of the monolithic conductive silicon-bearing layer, prior to the disposing the active metal material.

13. The method of claim 11 wherein the barrier layer is selected from a group of materials consisting of: a nitride, an oxide, titanium, titanium nitride, tantalum, tantalum nitride, tungsten, or tungsten nitride.

14. The method of claim 11
    wherein the active metal material comprises a metal selected from a group consisting of: aluminum, silver, platinum, palladium, copper, and nickel.

15. The method of claim 11 wherein the forming the amorphous layer from the upper region comprises an etch on an exposed surface of the monolithic conductive silicon-bearing layer, wherein the etch includes a material selected from a group consisting of: argon, silicon, oxygen.

16. The method of claim 11
    wherein the forming the amorphous silicon and oxygen-bearing layer comprises: performing an Argon plasma etch on an exposed surface of the monolithic conductive silicon-bearing layer using a bias power within a range of approximately 30 watts to approximately 120 watts.

17. The method of claim 11
wherein the forming the amorphous silicon and oxygen-bearing layer comprises: performing an ion implantation on an exposed surface of the monolithic conductive silicon-bearing layer; and
wherein an ion for the ion implantation is selected from a group consisting: argon, silicon, and oxygen.

18. The method of claim 11 wherein the amorphous silicon and oxygen-bearing layer has a thickness within the range of approximately 2 to approximately 10 nanometers.

19. The method of claim 11 wherein the amorphous silicon and oxygen-bearing layer has a thickness within the range of approximately 30 Angstroms to approximately 40 Angstroms.

20. The method of claim 11
wherein the monolithic conductive silicon-bearing layer comprises a p-doped $Si_xGe_{x-1}$; and
wherein the amorphous silicon and oxygen-bearing layer comprises SixGeyOz (x, y, z integers.

21. A method for forming a resistive memory device comprising:
providing a substrate comprising a first metal material;
forming a conductive silicon-bearing layer on top of the first metal material, wherein the conductive silicon-bearing layer comprises an upper region and a lower region, and wherein the lower region is adjacent to the first metal material;
forming an amorphous layer from the upper region of the conductive silicon-bearing layer, wherein forming the amorphous layer from the upper region comprises a process selected from a group consisting of:
performing an Argon, silicon, and/or oxygen plasma etch on an exposed surface of the conductive silicon-bearing layer; and
performing an ion implantation on the upper region of the conductive silicon-bearing, and wherein an ion for the ion implant is selected from a group consisting: Argon, silicon, and oxygen; and
disposing an active metal material above the amorphous layer.

22. The method of claim 21
wherein a barrier layer is formed on the amorphous layer prior to the disposing the active metal material above the amorphous layer; and
wherein the barrier layer comprises a nitride layer.

23. The method of claim 21 wherein the barrier layer has a thickness within the range of approximately 20 Angstroms to approximately 50 Angstroms.

24. The method of claim 21
wherein the active metal material comprises a metal selected from a group consisting of: aluminum, silver, platinum, palladium, copper, and nickel.

25. The method of claim 21 wherein the amorphous layer has a thickness within the range of approximately 2 to approximately 10 nanometers.

26. The method of claim 21 wherein the amorphous layer has a thickness within the range of approximately 30 Angstroms to approximately 40 Angstroms.

27. The method of claim 21
wherein the conductive silicon-bearing layer comprises polycrystalline silicon and germanium.

28. The method of claim 21 wherein the amorphous layer comprises SiOx.

29. The method of claim 21 further comprising forming a barrier layer on top of the active metal layer, wherein a material for the barrier layer is selected from a group consisting of: titanium, titanium nitride, tantalum, tantalum nitride, tungsten, and tungsten nitride.

30. The method of claim 21 wherein a thickness of the upper region of the conductive silicon-bearing layer is less than a thickness of the lower region of the conductive silicon-bearing layer.

* * * * *